(12) United States Patent
Scalia et al.

(10) Patent No.: US 8,488,361 B2
(45) Date of Patent: Jul. 16, 2013

(54) MEMORY SUPPORT PROVIDED WITH MEMORY ELEMENTS OF FERROELECTRIC MATERIAL AND IMPROVED NON-DESTRUCTIVE READING METHOD THEREOF

(75) Inventors: Antonio Maria Scalia, Catania (IT); Maurizio Greco, Acicastello (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 15 days.

(21) Appl. No.: 13/349,098

(22) Filed: Jan. 12, 2012

(65) Prior Publication Data
US 2012/0195093 A1   Aug. 2, 2012

(30) Foreign Application Priority Data

Feb. 1, 2011  (IT) ................ TO2011A0083
Mar. 1, 2011  (IT) ................ TO2011A0182

(51) Int. Cl.
*G11C 5/14* (2006.01)

(52) U.S. Cl.
USPC .......................................... 365/145; 365/158

(58) Field of Classification Search
USPC ................................ 365/145, 158
See application file for complete search history.

(56) References Cited

U.S. PATENT DOCUMENTS

| | | |
|---|---|---|
| 4,888,733 A | 12/1989 | Mobley |
| 5,086,412 A | 2/1992 | Jaffe et al. |
| 5,699,290 A | 12/1997 | Yoo ........................ 365/145 |
| 6,091,621 A | 7/2000 | Wang et al. |
| 6,335,550 B1 | 1/2002 | Miyoshi et al. |
| 6,819,583 B2 * | 11/2004 | Hsu et al. .................. 365/145 |

OTHER PUBLICATIONS

Cho et al., "Terabit inch-2 ferroelectric data storage using scanning nonlinear dielectric microscopy nanodomain engineering system", Institute of Physics Publishing, Nanotechnology No. 14 2003, 637-642.
Yoshihisa Kato, "0.18-μm nondestructive readout FeRAM using charge compensation technique", IEEE Transactions on electron devices, vol. 52 No. 12, 2005, 2016-2021.

* cited by examiner

*Primary Examiner* — Michael Tran
(74) *Attorney, Agent, or Firm* — Allen, Dyer, Doppelt, Milbrath & Gilchrist, P.A.

(57) ABSTRACT

A method is for non-destructive reading of an information datum stored in a memory that includes a first wordline, a first bitline and a second bitline, and a first ferroelectric transistor, which is connected between the bitlines and has a control terminal coupled to the first wordline. The method includes applying to the first wordline a first reading electrical quantity, generating a first difference of potential between the first and second bitlines, generating a first output electrical quantity, and applying to the first wordline a second reading electrical quantity. The method further includes generating a second difference of potential between the first and second bitlines, generating a second output electrical quantity, and comparing the first and second output electrical quantities with one another. On the basis of a result of said comparison, the method includes determining the logic value of the information data.

14 Claims, 10 Drawing Sheets

MEMORY SUPPORT PROVIDED WITH MEMORY ELEMENTS OF FERROELECTRIC MATERIAL AND IMPROVED NON-DESTRUCTIVE READING METHOD THEREOF

FIELD OF THE INVENTION

The present invention relates to a memory provided with elements of ferroelectric material and to a non-destructive method for reading the memory.

BACKGROUND OF THE INVENTION

As is known, in the context of storage systems, the need is felt to reach high storage capacities with high data-transfer rates (bitrates), while at the same time reducing the manufacturing costs. Storage systems currently most widely used, namely, hard-disk drives (with miniaturized dimensions) and flash RAMS, present intrinsic technological limits with respect to the increase of data-storage capacity and of read/write speed, as well as reduction of their dimensions.

Amongst existing technologies, storage systems that use a storage medium made of ferroelectric material, in which reading/writing of individual bits is made by interacting with the ferroelectric domains of the ferroelectric material, are very promising.

A ferroelectric material possesses a spontaneous polarization which can be reversed by an applied electrical field. As shown in FIG. 1, the material moreover presents a hysteresis cycle in the diagram of the polarization charge Q (or, equivalently, of the polarization P) as a function of the applied voltage V, and by exploiting this, it is possible to store information in the form of bits. In particular, in the absence of a biasing voltage imparted on the medium (V=0), there exist two points of the diagram in the stable state (designated by "b" and "e") that have different polarization, in particular equal and opposite. The points can remain in the stable state even for some years, thus maintaining the binary datum stored (for example, point "b", with positive charge $+Q_H$, corresponds to a "0", whereas point "e", with negative charge $-Q_H$, corresponds to a "1").

The writing operations envisage application to the ferroelectric medium of a positive or negative voltage higher than a coercive voltage $V_{coe}$ characteristic of the ferroelectric material. In this case, a positive charge $+Q_H$, or negative charge $-Q_H$ (this basically corresponds to a displacement along the diagram from point "e" to point "b" passing through point "a", or else from point "b" to point "e" passing through point "d") is stored in the material. A voltage having an absolute value that is lower than the coercive voltage V, does not, instead, cause a stable variation of the charge stored.

The data-reading techniques commonly used are based on a destructive operation, which envisages erasure of the data read. In summary, a (positive or negative) voltage having an amplitude greater than that of the coercive voltage $V_{coe}$ is applied to the ferroelectric material, thus performing in practice a writing operation, and the occurrence or otherwise of a reversal of polarity of the ferroelectric material is detected. For this purpose, the existence or not of an appreciable current that flows in the ferroelectric material is detected. Clearly, the application of a positive (or negative) voltage causes reversal of just the ferroelectric domains in which a negative charge $-Q_H$ (or positive charge $+Q_H$) has previously been stored.

The main problem of the reading technique is linked to the fact that the reading operations are destructive; i.e., they imply removal of the information stored previously and hence the impossibility of carrying out subsequent readings of the data themselves, without there having previously carried out a re-writing of the data read. In fact, reading of a portion of the memory corresponds to writing in the memory portion of a sequence of charges that are all positive (or all negative, in the case where a negative reading voltage is used). Consequently, during reading the flow of the data read is stored in a memory buffer, and a writing operation is then necessary for restoring the original information.

The reading technique entails a considerable expenditure of time and power, and basically creates a bottleneck for current ferroelectric storage systems, in particular as regards bitrate.

In order to overcome these issues some techniques of non-destructive reading of the data stored have been devised.

For example in Cho et al., "Terabit inch$^{-2}$ ferroelectric data storage using scanning nonlinear dielectric microscopy nanodomain engineering system", Nanotechnology No. 14, 2003, 637-642, Institute of Physics Publishing, a sinusoidal signal is applied to a ring electrode, which induces an oscillation in a resonant circuit that includes the ferroelectric medium in which the information bit is stored. A demodulator detects the harmonics of the induced oscillation, the phases of which are correlated to the information bit stored, on account of the different behaviour of the high-order nonlinear permittivities of the ferroelectric material in the stable points of the polarization diagram.

In Kato et al., "0.18-μm nondestructive readout FeRAM using charge compensation technique", IEEE Transactions on electron devices, Vol. 52 No. 12, December 2005, a reading circuit is described, which envisages a connection in series of a ferroelectric capacitor (constituted by the storage medium) to the gate terminal of a reading MOS transistor. By applying a reading pulse, the charge stored in the capacitor biases the gate terminal of the MOS transistor, in a different way according to the polarization state stored previously, thus varying the conductivity of the conduction channel thereof. Next, the datum stored is read by detecting the current that flows between the current-conduction terminals of the transistor itself, in a static way, by a sense amplifier.

The aforementioned reading techniques, albeit presenting the advantage of not being destructive and hence not requiring re-writing of the data read, are not altogether satisfactory with regard to the constructional complexity and their operation.

Other documents that describe memories comprising ferroelectric elements and corresponding read/write methods are the patents Nos. U.S. Pat. No. 5,086,412, U.S. Pat. No. 6,819,583, and U.S. Pat. No. 4,888,733. However, each of the memory cells according to these documents comprises one or more transistors for direct addressing of the memory cell, and at least one additional ferroelectric capacitor for storage of the charge that represents the logic information (bit "1" or bit "0") to be stored. Also the above approaches are not optimal in terms of occupation of area and operation. For example, some of these memories present problems of coupling between adjacent cells during the writing operations.

SUMMARY OF THE INVENTION

The aim of the present invention is to provide a memory having elements made of ferroelectric material, and a corresponding non-destructive reading method that will overcome the previously described disadvantages.

According to the present invention a memory having elements made of ferroelectric material and a corresponding non-destructive reading method are consequently provided, as defined in the annexed claims.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF THE PREFERRED EMBODIMENTS

Figure 2:
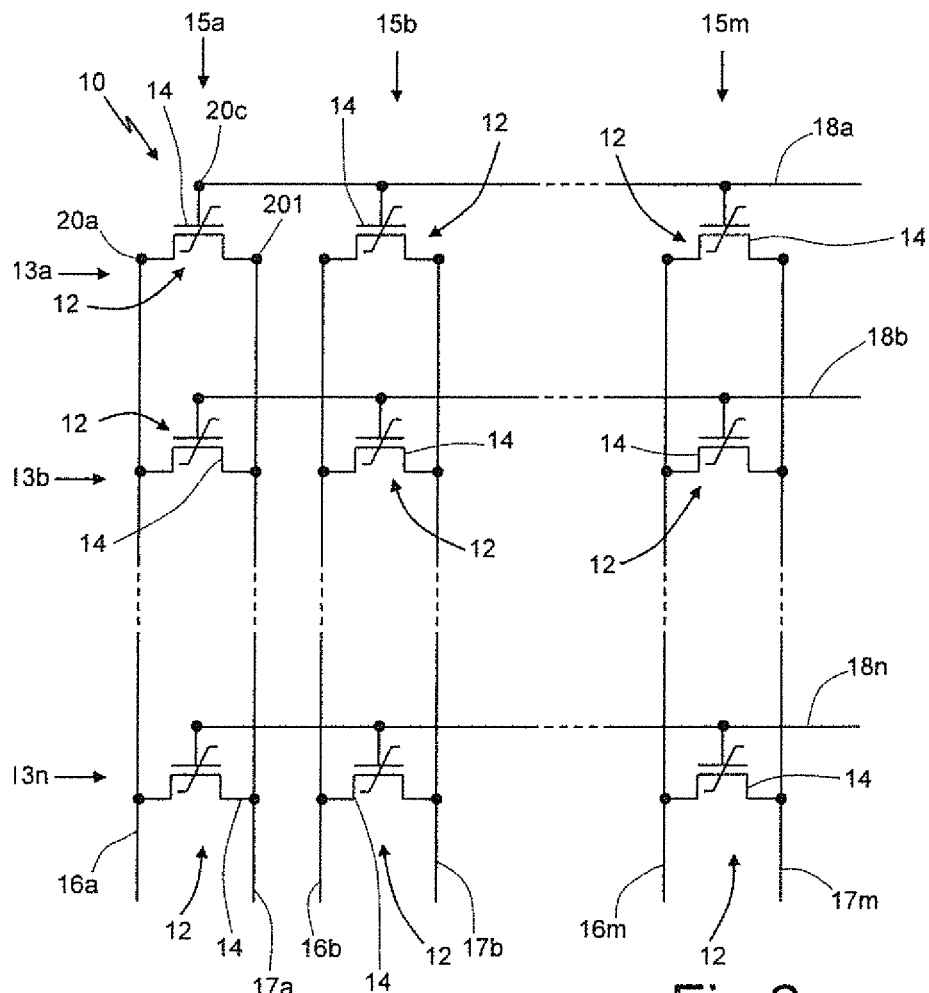
FIG. 2 shows a portion of a memory in which each memory cell is formed by a single FeFET, according to the present invention.

Designated by the reference number 10 in FIG. 2 is a portion of a memory (not shown as a whole) comprising a plurality of memory cells 12 arranged to form an array having a plurality of rows 13a, 13b, . . . , 13n (defined by a plurality of respective wordlines) and a plurality of columns 15a, 15b, . . . 15m (defined by a plurality of respective pairs of bitlines). It is evident that the memory portion 10 can comprise any number of rows and columns. In general, the memory portion 10 defines an array of memory cells 12 of dimensions (rows·columns) equal to n·m, with n and m integer numbers chosen as desired.

Each memory cell 12 comprises an electronic device having the function of co-operating in the selection of the respective memory cell 12 (for the steps of reading/writing of the respective memory cell) and of the element for storage of data (in particular, a logic datum "1" or "0"). In the following description the logic value "1" identifies a high logic value, whereas the logic value "0" identifies a low logic value. The voltage levels associated to the logic values "1" and "0" depend upon the physical structure of the components used, and their exact value is indifferent for the purposes of the present invention.

According to one embodiment of the present invention, the electronic device is a transistor 14, in particular of a FeFET (ferroelectric field-effect transistor) type. The memory cell 12 thus formed, comprising a single FeFET is also known as "1T" memory cell.

Each transistor 14 (see also FIGS. 3a-3c) has a first conduction terminal (source terminal) 20a, a second conduction terminal (drain terminal) 20b, and a control terminal (gate terminal) 20c. The transistors 14 belonging to one and the same column 15a-m have the respective first conduction terminals 20a connected to one and the same first bitline 16a, 16b, . . . , 16m, and the respective second conduction terminals 20b connected to one and the same second bitline 17a, 17b, . . . , 17c. In this way, for each column 15a-m, the transistors 14 are connected to one another in parallel.

For each row 13a-n, the control terminals 20c of each transistor 14 are connected to one and the same wordline 18a, 18b, 18n.

Figure 3A:
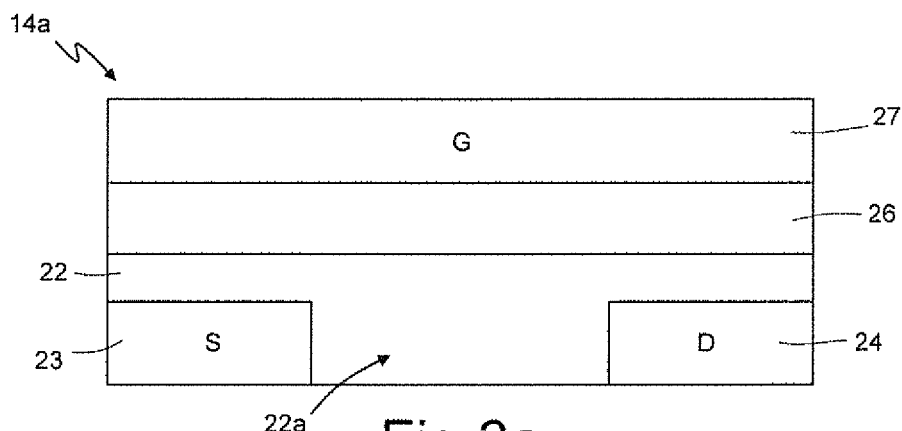
FIGS. 3a-3c show embodiments that are alternative to one another of FeFETs that can be used in the memory portion of FIG. 2.
Figure 3B:
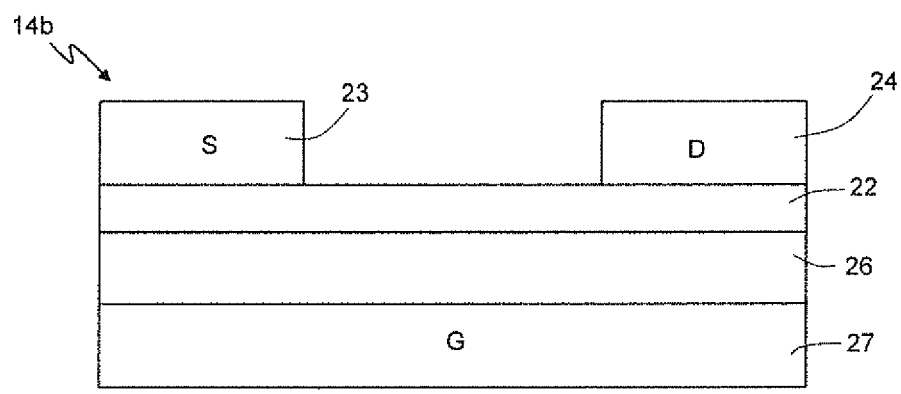
Figure 3C:
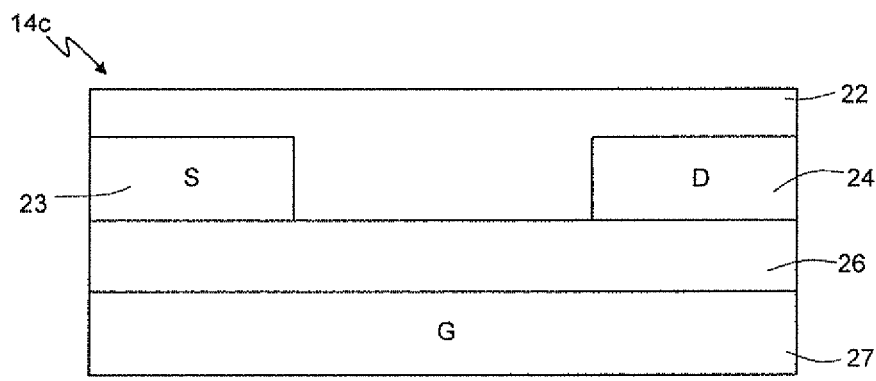

FIGS. 3a-3c show embodiments that are alternative to one another of a FeFET that can be used as memory cell 12 of the memory portion 10 of FIG. 2, in particular a single-transistor (1T) memory cell.

In particular, FIG. 3a shows, in cross-sectional view, a transistor 14a of a FeFET type with a structure of a top-gate type. The transistor 14a comprises a semiconductor layer 22, and a first conduction terminal 23, made of conductive material, designed to form a source terminal of the transistor 14a, formed partially in the semiconductor layer 22. The transistor 14a also includes a second conduction terminal 24, made of conductive material, designed to form a drain terminal of the transistor 14a, formed partially in the semiconductor layer 22 at a distance from the first conduction terminal 23 and laterally in contact with the first conduction terminal 23 by a portion of the semiconductor layer 22. The transistor 14a further includes a ferroelectric layer 26, preferably made of organic polymeric ferroelectric material, formed in contact with the semiconductor layer 22 and separated from the first and second conduction terminals 23, 24 by the semiconductor layer 22, and a control terminal 27 (gate terminal), made of conductive material, formed on, and in contact with, the ferroelectric layer 26. In this way, the ferroelectric layer 26 extends between the control terminal 27 and the semiconductor layer 22 in which the first and second conduction terminals 23, 24 are formed. The ferroelectric layer 26 has, in use, the function of memory element designed to store the logic datum that is to be stored. The transistor 14a can be used in the memory portion 10 of FIG. 2 to form the memory cell 12. In this case, the first conduction terminal 23 corresponds to the terminal 20a, the second conduction terminal 24 corresponds to the terminal 20b, and the control terminal 27 corresponds to the terminal 20c of the transistor 14 of FIG. 2.

In order to operate the transistor 14a as memory element, in particular for writing a logic datum in the memory element, a voltage is applied between the control terminal 27 and both of the conduction terminals 23, 24 in order to modify the state of polarization of the ferroelectric layer 26. By setting a pre-set and known state of polarization of the ferroelectric layer 26 the operation of writing of the logic datum is carried out. In particular, a first polarization state is associated to a first logic value, whereas a second polarization state is associated to a second logic value. The polarization state set remains in the ferroelectric layer 26 even following upon removal of the applied voltage.

In order to read a logic datum stored in the memory element formed by the transistor 14a, a voltage is applied across the first and second conduction terminals 23, 24, and the current that flows between the terminals 23, 24 is detected. The current that flows between the first and second conduction terminals 23, 24 is affected by the state of polarization of the ferroelectric layer 26, and the current value detected can thus be associated to the logic value stored. With reference to FIG. 3a, the portion of the semiconductor layer 22 comprised between the first and second conduction terminals 23, 24 has, in use during reading operations, the function of channel region of the transistor 14a, in which the charge carriers flow.

FIG. 3b shows, in cross-sectional view, a transistor 14b of a FeFET type, having a structure of a bottom-gate/top-contact type. The transistor 14b of FIG. 3b comprises, in a way similar to the transistor 14a of FIG. 3a (elements that are in common are designated by the same reference numbers), the control terminal 27, made of conductive material, having the function of gate terminal of the transistor 14b, the semiconductor layer 22, and the layer of ferroelectric material 26, preferably made of organic polymeric ferroelectric material, which extends between the semiconductor layer 22 and the control terminal 27. The transistor 14b also includes the first conduction terminal 23, which extends on top of and in electrical contact with the semiconductor layer 22, and the second conduction terminal 24, which extends on top of and in electrical contact with the semiconductor layer 22, at a distance from the first conduction terminal 23. The embodiment of FIG. 3b differs from the embodiment of FIG. 3a in so far as the first and second conduction terminals 23, 24 do not extend within the semiconductor layer 22, but on top of it. Operation of the transistor 14b, for the operations of writing and reading of a logic datum, is similar to what has been described with reference to the transistor 14a of FIG. 3a, and the transistor 14b can hence be used as memory cell 12 in the memory portion 10 of FIG. 2.

FIG. 3c shows, in cross-sectional view, a transistor 14c of a FeFET type, having a structure of the bottom-gate type, according to a further embodiment alternative to the one shown in FIGS. 3a, 3b. The transistor 14c of FIG. 3c has a structure similar to that of the transistor 14b of FIG. 3b, but differs from the latter on account of the presence of a semiconductor layer 22, which extends underneath, between, and on top of the first and second contact terminals 23, 24. In order to access the first and second conduction terminals 23, 24 appropriate contacts (not shown) must be formed, which extend through the portion of the semiconductor layer formed on top of the first and second conduction terminals 23, 24. Operation of the transistor 14c, for the operations of writing and reading of a logic datum, is similar to what has been described with reference to the transistor 14a of FIG. 3a, and the transistor 14c can hence be used as memory cell 12 in the memory portion 10 of FIG. 2.

Figure 4:
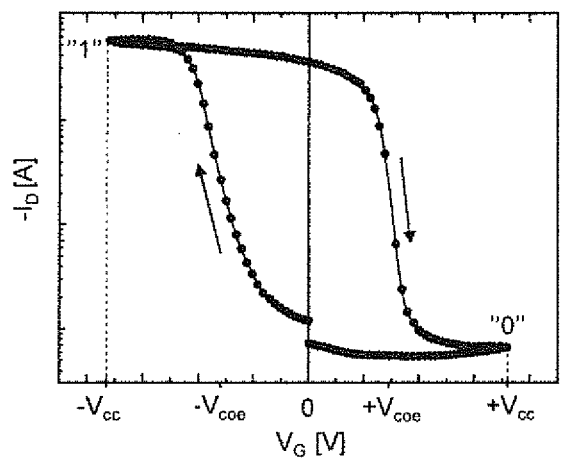
FIG. 4 shows an example of transcharacteristic curve for a generic FeFET, according to the present invention.

FIG. 4 shows a transcharacteristic curve typical of a FeFET. The axis of the abscissae represents the voltage $V_G$ applied to the gate terminal of the FeFET, whilst the axis of the ordinates (in logarithmic scale) represents the current $I_D$ that flows between the source terminal and the drain terminal as the voltage $V_G$ varies. A voltage value $V_G \approx V_{cc}$ corresponds to setting a first given state of polarization of the ferroelectric material of the FeFET, corresponding to a minimum value of current $I_D$, which can be associated to the low logic value ("0"). A voltage value $V_G \approx -V_{cc}$ corresponds to setting a second given state of polarization of the ferroelectric material of the FeFET (opposite to the first polarization state), corresponding to a maximum value of current $I_D$, which can be associated to the high logic value ("1").

Figure 1:
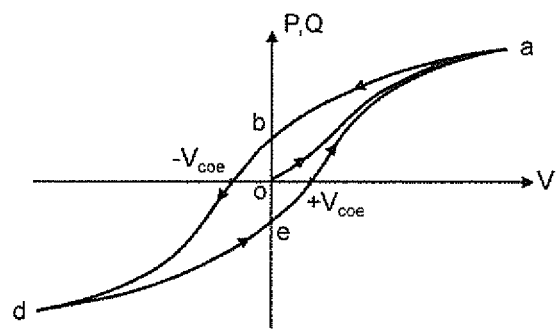
FIG. 1 is a plot representing a hysteresis cycle of a ferroelectric material of a storage medium, according to the prior art.

The transition between the two polarization states follows a hysteresis curve, as already discussed with reference to FIG. 1.

Figure 5:
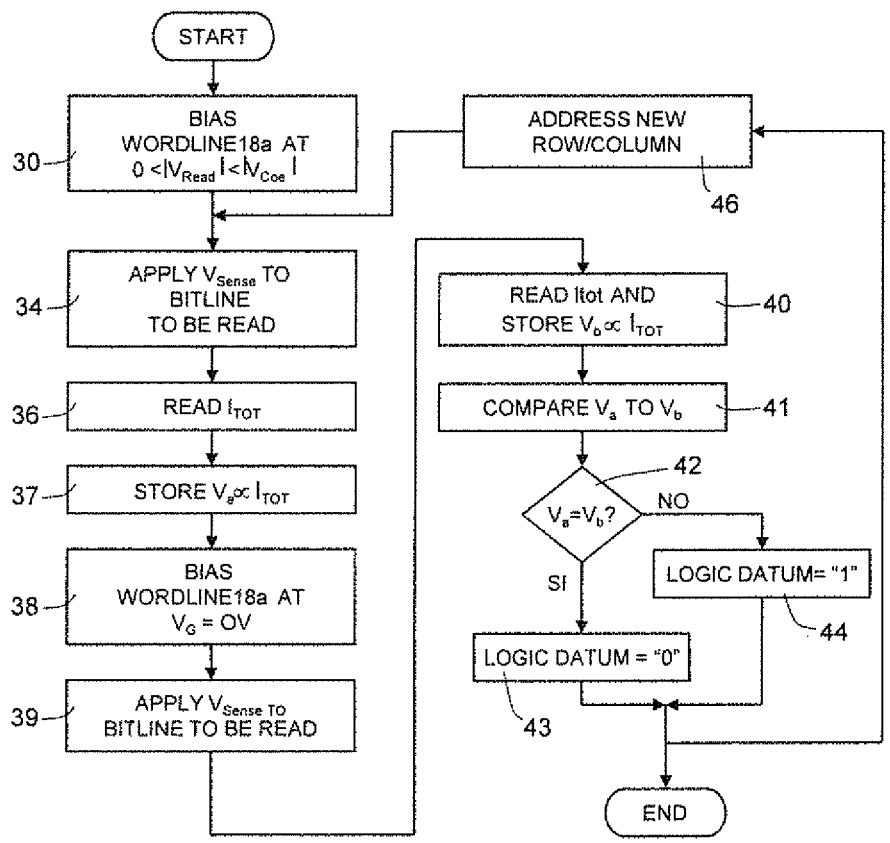
FIG. 5 shows steps of a method for non-destructive reading of memory cells of the memory portion of FIG. 2, according to the present invention.
Figure 6:
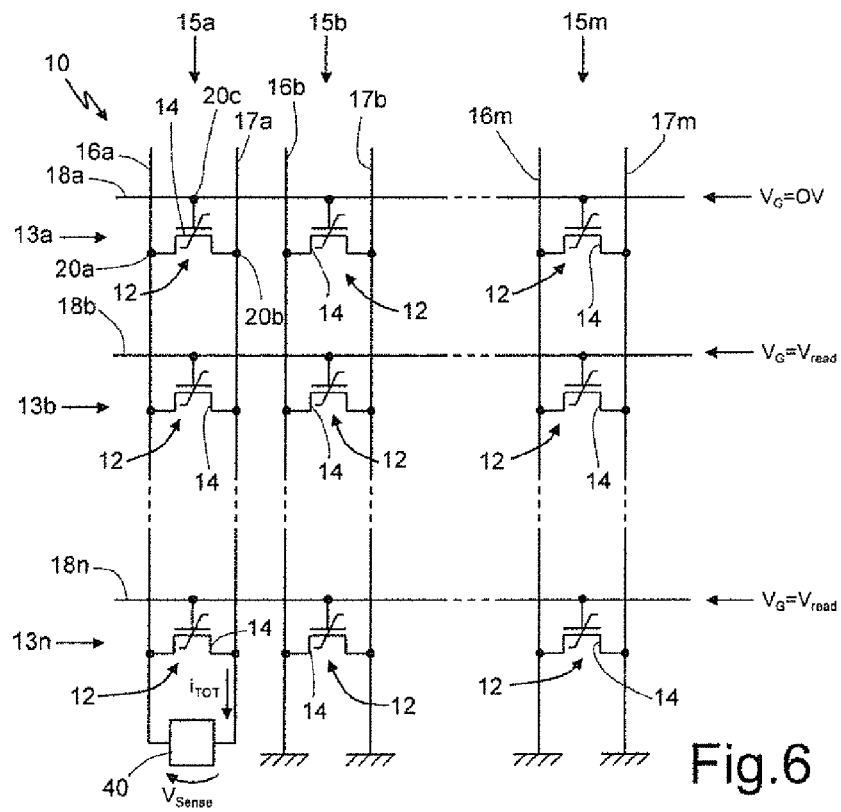
FIG. 6 shows the memory portion of FIG. 2 during a reading step according to the method of FIG. 5.

FIG. 5 shows, by a flowchart, steps of a method for non-destructive reading of the memory portion 10 of FIG. 2. FIG. 6 illustrates the memory portion 10 during reading of a memory cell 12, representing voltage signals applied to the bitlines and to the wordlines for reading the memory cell 12 selected.

It is assumed, with reference to FIG. 6, that the memory cell 12 to be read is the memory cell 12 set at the intersection between the row 13a and the column 15a.

In step 30 of FIG. 5, the wordlines 18a-n are biased at the reading voltage $V_{read}$ such that $0<|V_{read}|<|V_{coe}|$. In other words, the gate terminals 20c of the transistors 14 connected to the wordlines 18a-n are biased at a voltage higher than 0 V and such as not to be higher than the coercive voltage $V_{coe}$ (which, as has been said, is positive or negative according to the logic datum written in the memory cell 12). In fact, if the coercive voltage $V_{coe}$ were to be exceeded ($|V_{read}|>|V_{coe}|$), the memory cell 12 would be rewritten.

Then (step 34), by applying an appropriate voltage $V_{sense}$ between the bitlines 16a, 17a, it is possible to carry out an operation of detection of the current that flows between the source terminals 20a (connected to the bitline 16a) and the drain terminals 20b (connected to the bitline 17a) of the transistors 14 belonging to the column 15a. The voltage $V_{sense}$ has a value such that $(V_{sense}-V_{read})<V_{coe}$. bitlines 16b-m, 17b-m are biased at ground voltage (e.g., 0 V). In general, the bitlines 16b-m, 17b-m are biased at a reference voltage, which can be different from 0 V.

Each transistor 14 belonging to the addressed column 15a shows a channel resistance of a high or low value, according to the state of polarization of the ferroelectric layer, corresponding to the logic value "0" or "1" stored (see FIG. 4). The current that flows between the source terminal 20a and the drain terminal 20b of each transistor 14 is hence a function of the voltage applied to the respective gate terminal 20c and of the state of polarization of the ferroelectric layer. The current $i_{TOT}$ that flows between the bitlines 16a and 17a is hence the total current that flows through all the transistors 14 (connected in parallel to one another) belonging to the column 15a and is not indicative, considered in itself, of the logic value stored in the memory cell 12 that is to be read. The total current $i_{TOT}$ is read during step 36. As described more fully hereinafter, according to one embodiment of the present invention, the value of total current $i_{TOT}$ read during step 36 is converted into a corresponding voltage value $V_a$, which is stored (step 37), for example by charging a capacitor.

Biasing of the bitlines at a voltage $V_{sense}$ and reading of the total current $i_{TOT}$ are made by means of an appropriate circuit for biasing and reading of the current (of a type in itself known), as shown schematically in FIG. 6 and designated by the reference number 40.

Then (step 38), the biasing voltage of the wordline 12a is varied from $V_{read}$ to a reference value $V_{ref}$, for example equal to 0 V.

Figure 7A:
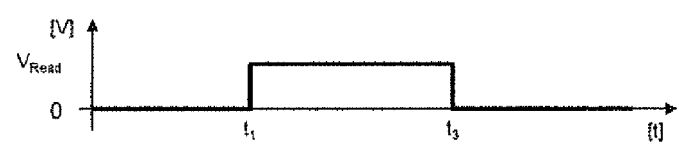
FIGS. 7a and 7b show the plot of voltage signals used for the reading steps according to the method of FIG. 5.
Figure 7B:
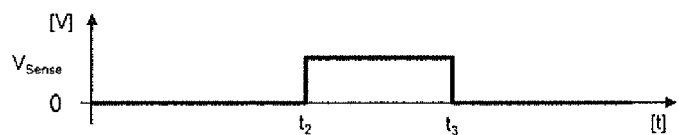

FIGS. 7a and 7b show schematically the time plot of the signals used for biasing the bitlines and the wordlines. The voltage $V_{read}$ applied to the wordline 13a (FIG. 7a) has a boxcar waveform, with rising edge at time t1 and falling edge at time t3. The amplitude in voltage (axis of the ordinates) is of some volts (for example, between 3 and 10 V, but these values can vary according to the physical characteristics of the transistors 14 used).

The voltage $V_{sense}$ applied to the bitlines 16a, 17a (FIG. 7b) also has a boxcar waveform, with rising edge at time t2, of a value comprised between t1 and t3. The time interval t1-t2 is chosen so as to be longer than the transient for obtaining a correct biasing of the gate terminal 20c of the transistor 14 of the memory cell 12 to be read. In the interval t2-t3 also reading of the current $i_{TOT}$ is carried out according to the step 36 of FIG. 5.

The remaining bitlines 16b-m, 17b-m are at ground voltage (e.g., 0 V).

As may be noted from the curve of FIG. 4, for voltages applied to the gate terminals 20c of the transistors 14 equal to 0 V, there is a non-zero passage of current between the respective source terminal 20a and drain terminal 20b. The value of the current that flows for zero gate voltages depends upon the state of polarization of the ferroelectric layer of each respective transistor 14 (i.e., upon the logic datum stored). For example, if in the memory cell 12 a logic value "0" is stored, the current $I_D$ that flows between the source terminal 20a and the drain terminal 20b has a low value (indicatively, a fraction of nanoamps, e.g. 0.7 nA). Otherwise, in the case where a logic value "1" is stored, the current $I_D$ has a high value (indicatively, some tens of nanoamps, e.g. 80 nA). It is evident that the exact values of the current $I_D$ depend upon the structure and upon the type of FeFET used, and can vary on the basis of the operating conditions (e.g., temperature of use) and/or for reasons linked to the steps for manufacture of the FeFETs (for example, the thicknesses of the layers, the doping values, the process spread, etc.).

It is moreover evident that as we move away from the zero voltage value on the gate, the values vary. In this regard, when in the memory cell 12 a logic value "1" is stored (condition of channel with low electrical resistance), and a voltage is applied on the gate equal to $V_{read}$ (e.g., $V_{read}$=5V), it is possible to note a variation of the current that flows between the source and drain terminals for the transistor 14 of that memory cell 12 (for example, the current drops from approximately 80 nA to 40 nA).

Figure 8:
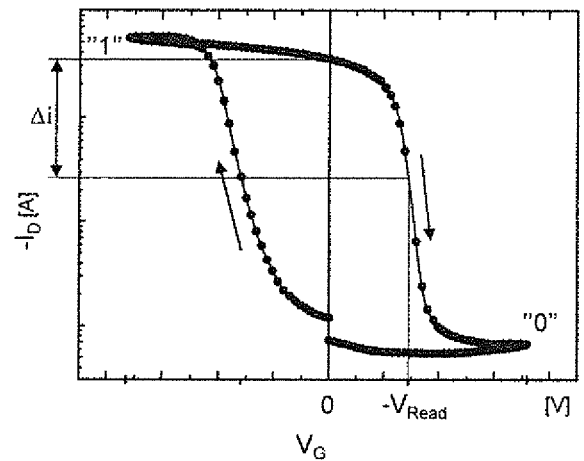
FIG. 8 represents the transcharacteristic curve of FIG. 2, which shows a variation of output current of the FeFET as a function of the voltage signals used for the reading steps according to the method of FIG. 5.

Reference may be made, for example, to FIG. 8. From the transcharacteristic curve of the output current of the FeFET it may be noted that the current value ($I_D$) drops significantly (by a term $\Delta i$) by increasing the voltage on the gate beyond the value $V_G$=0 (if we consider that the axis of the abscissae is in logarithmic scale said variation is even more evident). From FIG. 8 it should moreover be noted that, given the same voltage $V_{read}$, the variation of current $I_D$ is instead evident when in the memory cell 12 a logic value "0" is stored (condition of channel with high electrical resistance).

To return to step 38 of FIG. 5, the variation of the biasing of the gate terminal of the transistor that is being read from $V_G$=$V_{read}$ to $V_G$=0 V has, on the total current $i_{TOT}$, two different effects according to whether the logic value stored in the transistor 14 is a "1" or a "0". If the logic value is a "0", the variation of voltage on the gate from $V_{read}$ to 0 V does not cause a significant variation of total current $i_{TOT}$. Instead, if the logic value is a "1", the variation of voltage on the gate from $V_{read}$ to 0 V causes a significant variation of total current $i_{TOT}$ (for example, 50%. However, this percentage value may differ according to the value chosen for $V_{read}$ and to the output transcharacteristic curve of the transistor 14).

Next (step 39), the bitlines 16a, 17a are again biased at a voltage $V_{sense}$, and (step 40) a new reading is carried out of the current value $i_{TOT}$ generated as a consequence of application of the voltage $V_{sense}$ according to step 39.

The new current value $i_{TOT}$ detected according to step 40 is converted into a corresponding voltage value $V_b$ and supplied at input to a first input of a comparator. The second input of the comparator receives the voltage value $V_a$ correlated to the value of total current $i_{TOT}$ acquired previously (step 36) and stored during step 37. The comparator carries out a comparison (step 41) between the values of the two voltages $V_a$ and $V_b$ that it receives at input and supplies at output a result of said comparison.

On the basis of the result of the comparison, a check is made to establish (step 42) whether the value of total current $i_{TOT}$ acquired in step 36 has remained substantially unvaried with respect to the value of total current $i_{TOT}$ acquired in step 40, or else whether the two values are markedly different from one another. The value whereby the aforementioned two values are markedly different from one another is chosen in such a way as to guarantee at the same time a sufficient immunity to noise and an adequate sensitivity to the variations of total current $i_{TOT}$ caused by the variation of the value of biasing voltage of the gate terminal 20c of the transistor 14 that is being read.

It may hence be concluded that, if the value of total current $i_{Tar}$ acquired in step 36 has remained substantially unvaried with respect to the value of total current $i_{TOT}$ acquired in step 40, then the logic value stored in the transistor 14 that is being read is "0" (step 43, output YES from step 42). Otherwise, the logic value stored is "1" (step 44, output NO from step 42).

Then, reading of the next memory cell 12 is carried out. In particular, to speed up the reading operations, it is preferable to read in sequence the memory cells 12 belonging to one and the same column and then, once the complete column has been read, pass on to the next column. Moreover, during reading of the memory cells 12 belonging to one and the same column 15a-m, it is not necessary to re-bias at the value $V_G$=$V_{read}$ the gate terminal of the transistor 14 that has previously been read. After step 43 or step 44 the reading method terminates (no further memory cell to be read), or else control returns to step 34 (reading of a new memory cell), passing through step 46 for addressing a new row and possibly, according to the memory cell 12 to be read, of a new column.

According to a further embodiment of the present invention, reading of the memory cells 12 belonging to different columns 15a-m may be performed simultaneously. In fact, a voltage $V_G$=0 V (or, likewise at $V_G$=$V_{read}$) that biases a wordline 18a-n biases the gate terminals of the transistors 14 belonging to one and the same row 13a-n.

By coupling a circuit for biasing and reading of the current 40 to each of the bitlines 16a-m, 17a-m of each column 15a-m, it is possible to bias at a voltage $V_{sense}$ the bitlines simultaneously and hence read simultaneously the values of current $i_{TOT}$ for each column 15a-m. There is in this case the advantage of being able to carry out a reading of the entire memory portion 10 in short times.

It is evident from FIG. 8 that, by applying a voltage $V_G$=$V_{read}$ lower than 0 V and then by varying said voltage $V_G$ to send it to the value of 0 V (as per step 38 of FIG. 5), the evaluation step 42 will yield a result opposite to the one described previously.

In fact, in this case, a sensible variation of current will be obtained (reduction of the total current $i_{TOT}$) in the case where the logic value stored in the memory cell 12 is a "0". Otherwise, in the case where the logic value stored in the memory cell 12 is a "1", a sensible variation of total current $i_{TOT}$ will not be obtained. As has been said previously, a variation is considered "sensible" if it exceeds a certain threshold of a pre-set (or in any case settable) value.

FIGS. 9a-9f are graphic representations of some of the steps of the reading method of FIG. 5 (storage and comparison of the voltage values $V_a$ and $V_b$ associated to the values of total current $i_{TOT}$ acquired in successive instants), to provide a better illustration of the circuit operation of the memory according to the present invention.

The steps described are graphically shown using a schematic circuit representation, in which a comparison circuit 49 comprises a bitline 17a-m belonging to the column 15a-m that is being read (in particular, in this example, the bitline 17a), and a comparator 50, having a first input 50a and a second input 50b; a ground-reference terminal GND. The comparison circuit further comprises a capacitor 52, a resistor 54, having resistance R, connected between the bitline 17a and the ground reference GND, a first switch 56 (for example, provided in MOS technology), and a second switch 58 (for example, also provided in MOS technology).

The first switch 56 can be operated for coupling the bitline 17a alternatively to the first input 50a of the comparator 50 and to a first terminal of the capacitor 52. A second opposite terminal of the capacitor 52 is connected to ground GND. The second switch 58 can be operated for coupling the second input 5ob of the comparator 50 alternatively to the ground-reference terminal GND and to the first terminal of the capacitor 52.

The operations of switching of the first and second switches 56, 58 are carried out with a temporal cadence defined by a clock signal CLK.

It is now assumed that we are at the end of the step 34 of FIG. 5. In this case, a current $i_{TOT}$ flows in the bitline 17a. The current $i_{TOT\_1}$ is converted into the voltage value $V_{a\_1}$ by the resistor 54 (in a way in itself known).

Figure 9A:
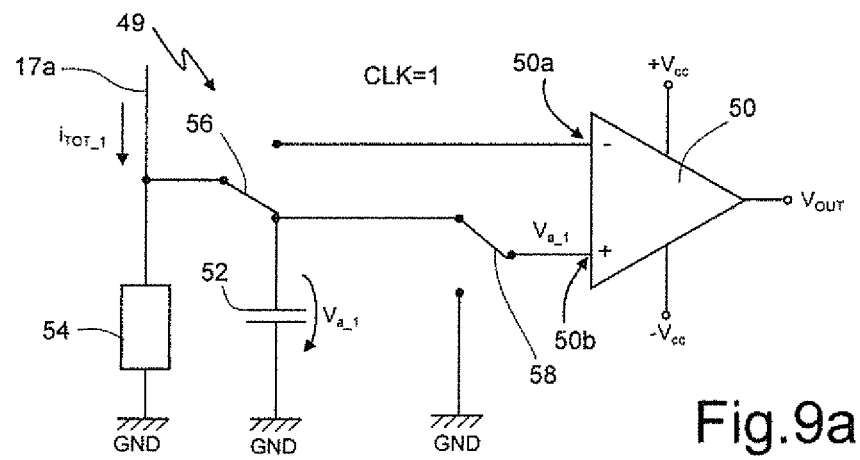
FIGS. 9a-9f show a circuit that can be used for carrying out the comparison step of FIG. 5, according to one embodiment of the present invention.

With reference to FIG. 9a, the first switch 56 is operated so as to couple the bitline 17a electrically to the first terminal of the capacitor 52. The second switch 58 is operated so as to couple the first terminal of the capacitor 52 electrically to the second input 50b of the comparator 50. During this step, the capacitor 52 is charged at a voltage $V_{a\_1}$ proportional to the current $i_{TOT\_1}$ that flows in the bitline 17a ($V_{a\_1}=R\cdot i_{TOT\_1}$ at a time defined by the clock signal CLK=1). In this way, step 37 of FIG. 5 is completed.

Then, steps 38 and 39 of FIG. 5 are carried out, after which control goes to step 40. During this step, a voltage value $V_{b\_1}$ is generated proportional to the current $i_{TOT\_2}$ that flows in the bitline 17a ($V_{b\_1}=R\cdot i_{TOT\_2}$ at the time defined by the clock signal CLK=2).

Figure 9B:
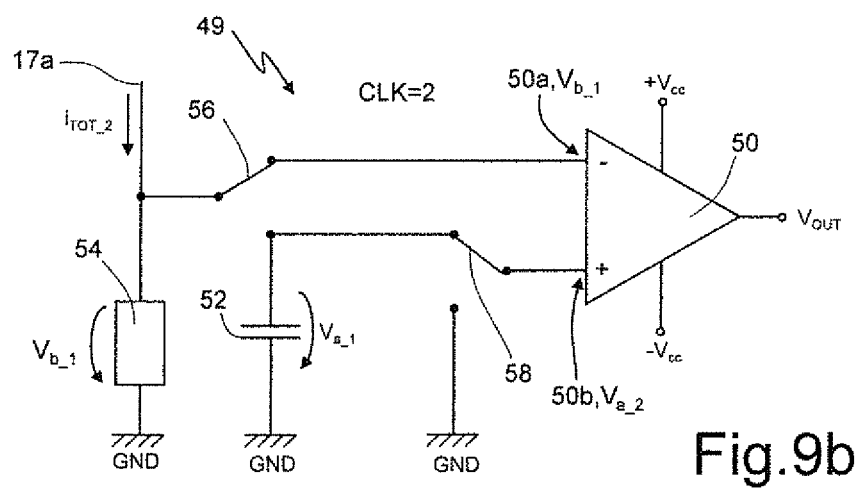
Figure 9C:
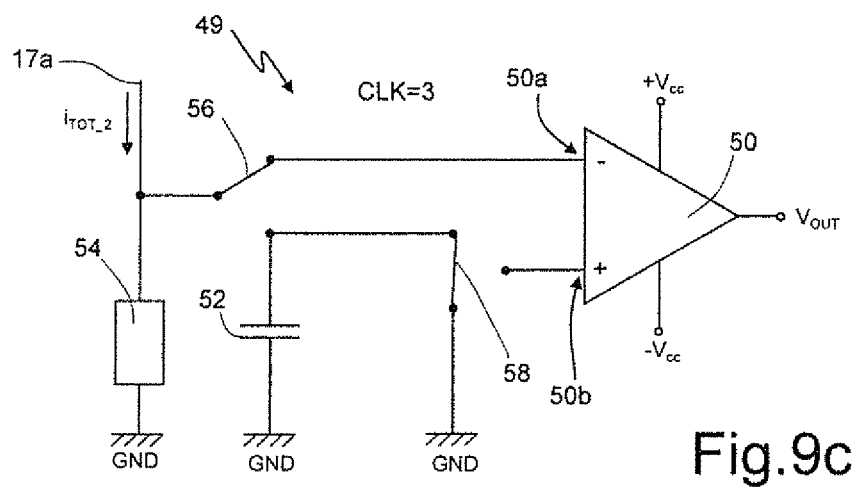

Next the comparison described by steps 41-44 of FIG. 5 is carried out. With reference to FIG. 9b, the first switch 56 is operated so as to couple the bitline 17a electrically to the first input 50a of the comparator 50, while the second switch 58 is operated so as to couple the first terminal of the capacitor 52 electrically to the second input 50b of the comparator 50. The voltage value $V_{a\_1}$ proportional to the total current $i_{TOT\_1}$ at time CLK=1 is compared with the voltage value $V_{b\_1}$ proportional to the total current $i_{TOT\_2}$ at time CLK=2. The signal $V_{out}$ at output from the comparator 50 is used as described previously for evaluating the logic value of the datum stored in the memory cell 12 that is being read.

In order to carry out reading of a new memory cell 12, it is expedient to discharge the capacitor 52. For this purpose (FIG. 9c), the second switch 58 is operated to connect the first terminal of the capacitor 52 to the ground-reference terminal GND (instant defined by the clock signal CLK=3).

Then, after addressing a new memory cell 12 to be read, step 36 and the following ones of FIG. 5 can be carried out.

Figure 9D:
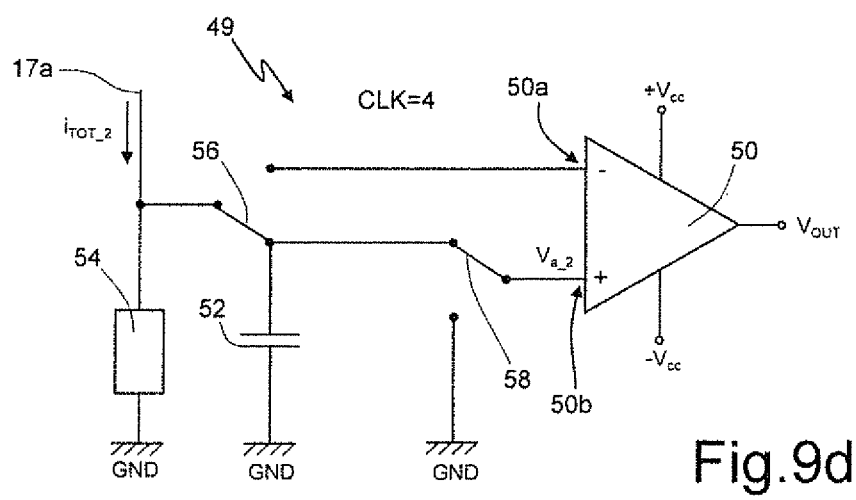

In particular, FIG. 9d (instant CLK=4), the first switch 56 is operated for connecting the bitline 17a electrically to the first terminal of the capacitor 52. In this way, the capacitor 52 is charged at a new voltage value $V_{a\_2}$ proportional to the total current $i_{TOT\_2}$ that flows in the bitline 17a at time CLK=4. It should be noted that the value $V_{a\_2}$ is equal to the voltage value $V_{b\_1}$ that was supplied to the comparator 50 at the instant CLK=2 but that had not been stored.

Figure 9E:
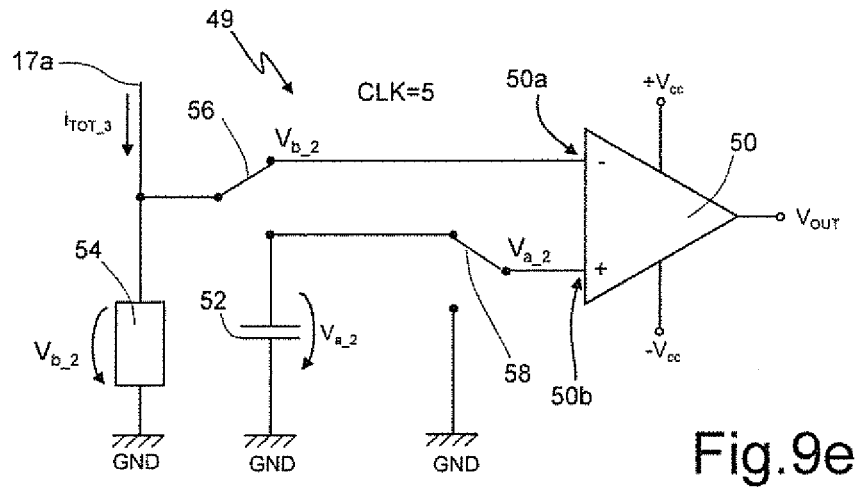
Figure 9F:
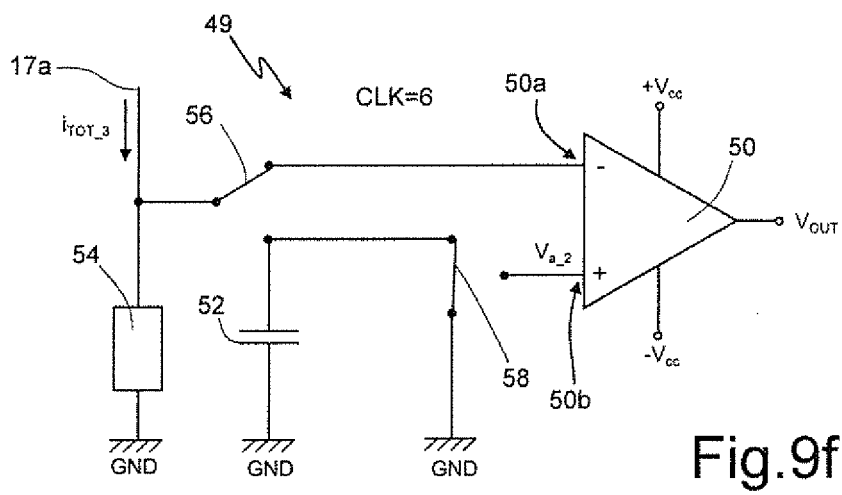

Then, with reference to FIG. 9e (instant CLK=5), the first switch 56 is operated so as to couple the bitline 17a electrically to the first input 50a of the comparator 50, whilst the second switch 58 is operated so as to couple the first terminal of the capacitor 52 electrically to the second input 50b of the comparator 50, in a way similar to what has already been described with reference to FIG. 9b. The voltage value $V_{a\_2}$, proportional to the total current $i_{TOT\_2}$ at time CLK=4, is compared with the voltage value $V_{b\_2}$ proportional to the total current $i_{TOT\_3}$ at time CLK=5. The signal $V_{out}$ at output from the comparator 50 is used as described previously for evaluating the logic value of the datum stored in the memory cell 12 that is being read.

Finally (FIG. 9f), the capacitor 52 is again discharged by being connected to the ground terminal GND, and acquisition of a new logic datum is carried out.

FIGS. 10a-10d are graphic illustrations of some of the steps of the reading method of FIG. 5 (storage and comparison of the voltage values $V_a$ and $V_b$ associated to the values of total current $i_{TOT}$ acquired in successive instants), according to a circuit embodiment alternative to the one shown in FIGS. 9a-9f.

The embodiment according to FIGS. 10a-10d comprises two comparison circuits 58 and 59, both of the type shown in FIGS. 9a-9f, which can be coupled to a single bitline (also here, by way of example, the bitline 17a is shown) connected to a ground terminal GND via the resistor 54.

The comparison circuit 58 hence comprises: a comparator 60, having a first input 60a and a second input 60b; a ground-reference terminal GND; a capacitor 62; and a switch 66 (for example, provided in MOS technology). The comparison circuit 59 comprises: a comparator 70, having a first input 70a and a second input 70b; a ground-reference terminal GND; a capacitor 72; and a switch 76 (for example, provided in MOS technology). A further switch 80, which is also, for example, provided in MOS technology, can be operated for connecting the bitline 17a electrically alternatively to the first input 60a of the comparator 60, to the second input 60b of the comparator 60, to the first input 70a of the comparator 70, and to the second input 70b of the comparator 70.

Figure 10A:
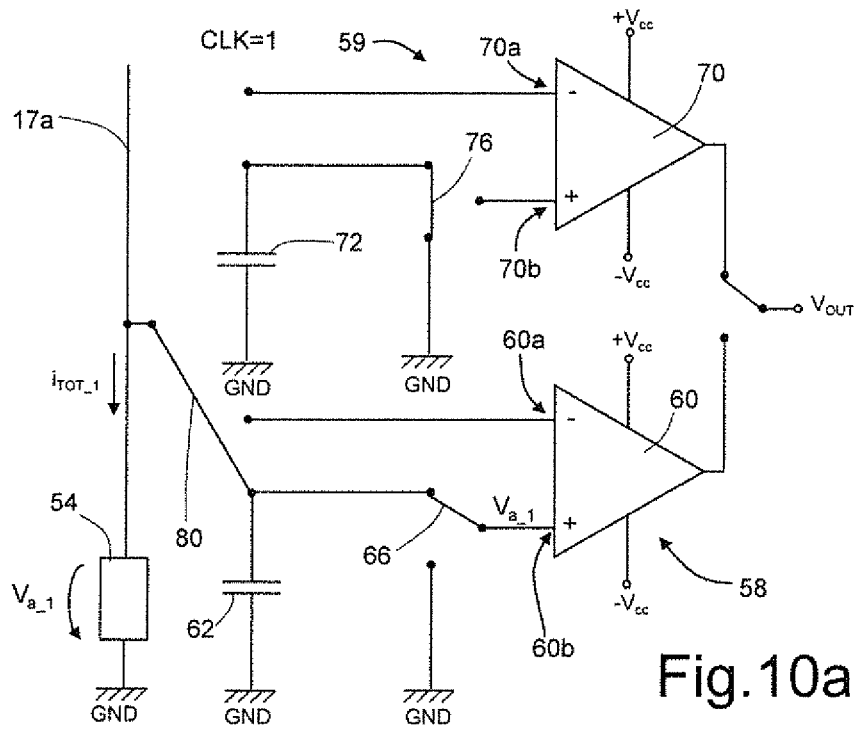
FIGS. 10a-10d show a circuit that can be used for carrying out the comparison step of FIG. 5, according to an embodiment alternative to that of FIGS. 9a-9f.

With reference to FIG. 10a, it is assumed that we are at the end of step 34 of FIG. 5. In this case, a current $i_{TOT\_1}$ flows in the bitline 17a. The current $i_{TOT\_1}$ is converted into the voltage value $V_{a\_1}$ by means of the resistor 54 (in a way in itself known).

With reference to FIG. 9a, during a first instant defined by a clock CLK (CLK=1), the switch 80 is operated so as to couple the bitline 17a electrically to the capacitor 62; the switch 66 is operated so as to couple the capacitor 62 electrically to the second input 60b of the comparator 60. During this step, the capacitor 62 is charged at a voltage $V_{a\_1}$ proportional to the current $i_{TOT\_1}$ that flows in the bitline 17a ($V_{a\_1}R\cdot i_{TOT\_1}$). In this way, step 37 of FIG. 5 is completed.

Then, steps 38 and 39 of FIG. 5 are carried out, and control goes to step 40. During this step, a voltage value $V_{b\_1}$ is generated proportional to the current $i_{TOT\_2}$ that flows in the bitline 17a ($V_{b\_1}=R\cdot i_{TOT\_2}$ at the time defined by the clock signal CLK=2).

Figure 10B:
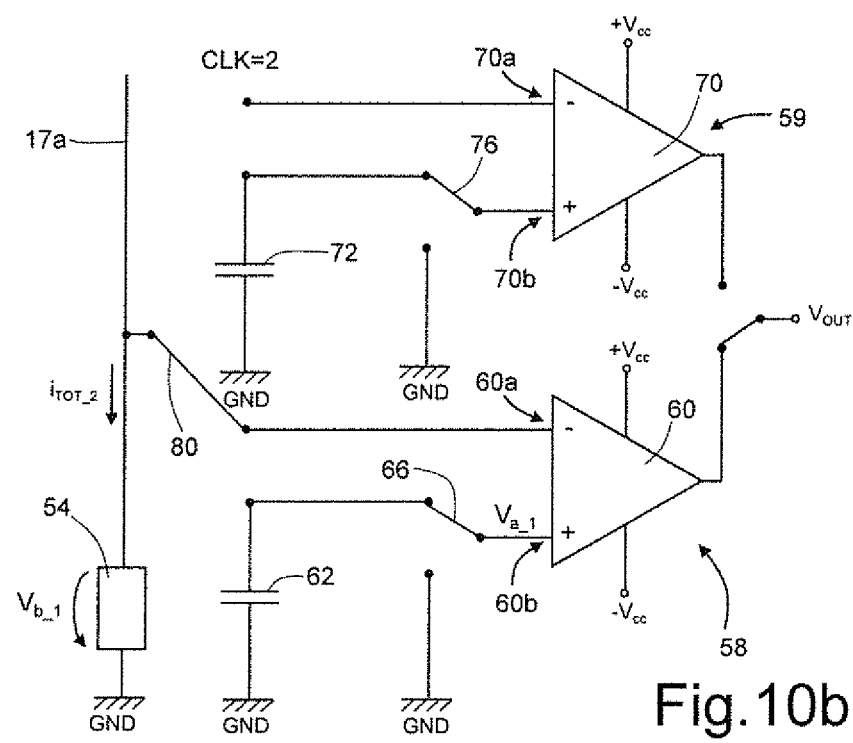

Next, the comparison described by steps 41-44 of FIG. 5 is carried out. With reference to FIG. 10b, the switch 80 is operated so as to couple the bitline 17a electrically to the first input 60a of the comparator 60, whilst the switch 66 is operated so as to couple the capacitor 62 electrically to the second input 60b of the comparator 60. The voltage value $V_{a\_1}$ proportional to the total current $i_{TOT\_1}$ (acquired at the instant CLK=1) is compared with the voltage value $V_{b\_1}$ proportional to the total current $i_{TOT\_2}$ at the instant CLK=2. The signal $V_{out}$ at output from the comparator 60 is used as described previously for evaluating the logic value of the datum stored in the memory cell 12 that is being read.

To carry out reading of a new memory cell 12, as already seen previously, it is expedient to discharge the capacitor 62. For this purpose (FIG. 10c), the switch 66 is operated for connecting the capacitor 62 to the ground-reference terminal GND (instant defined by the clock signal CLK=3). Simultaneously, reading of a new memory cell 12 can be performed, by following again step 36 and the following ones of FIG. 5.

Figure 10C:
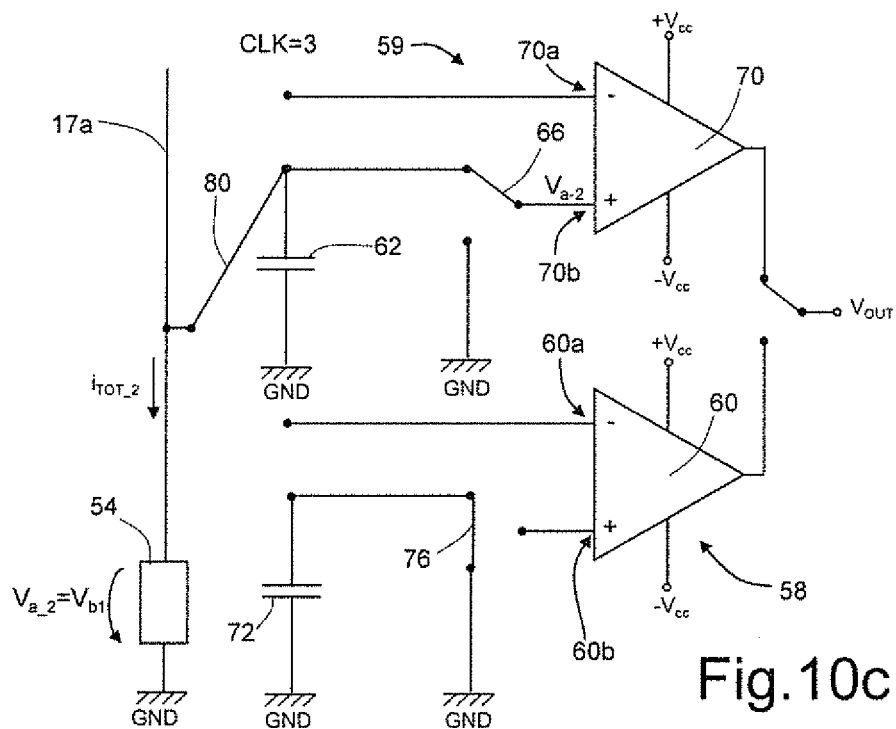
Figure 10D:
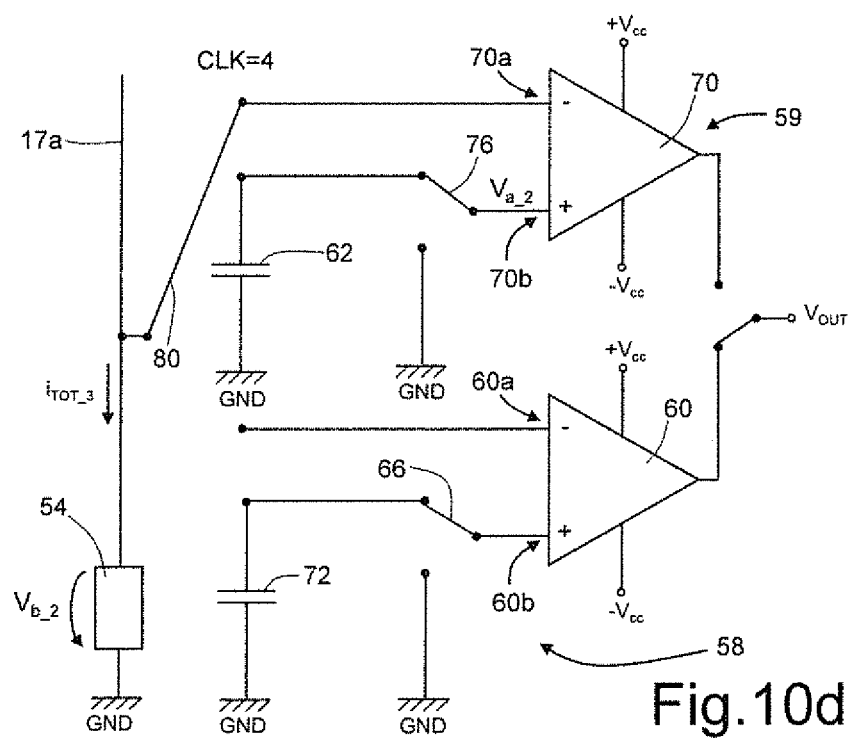

As shown in FIGS. 10c and 10d, said acquisition is carried out by the comparison circuit 59 in two successive instants CLK=3 (storage of the voltage value in the capacitor 72) and CLK=4 (comparison by means of the comparator 70).

Figure 11:
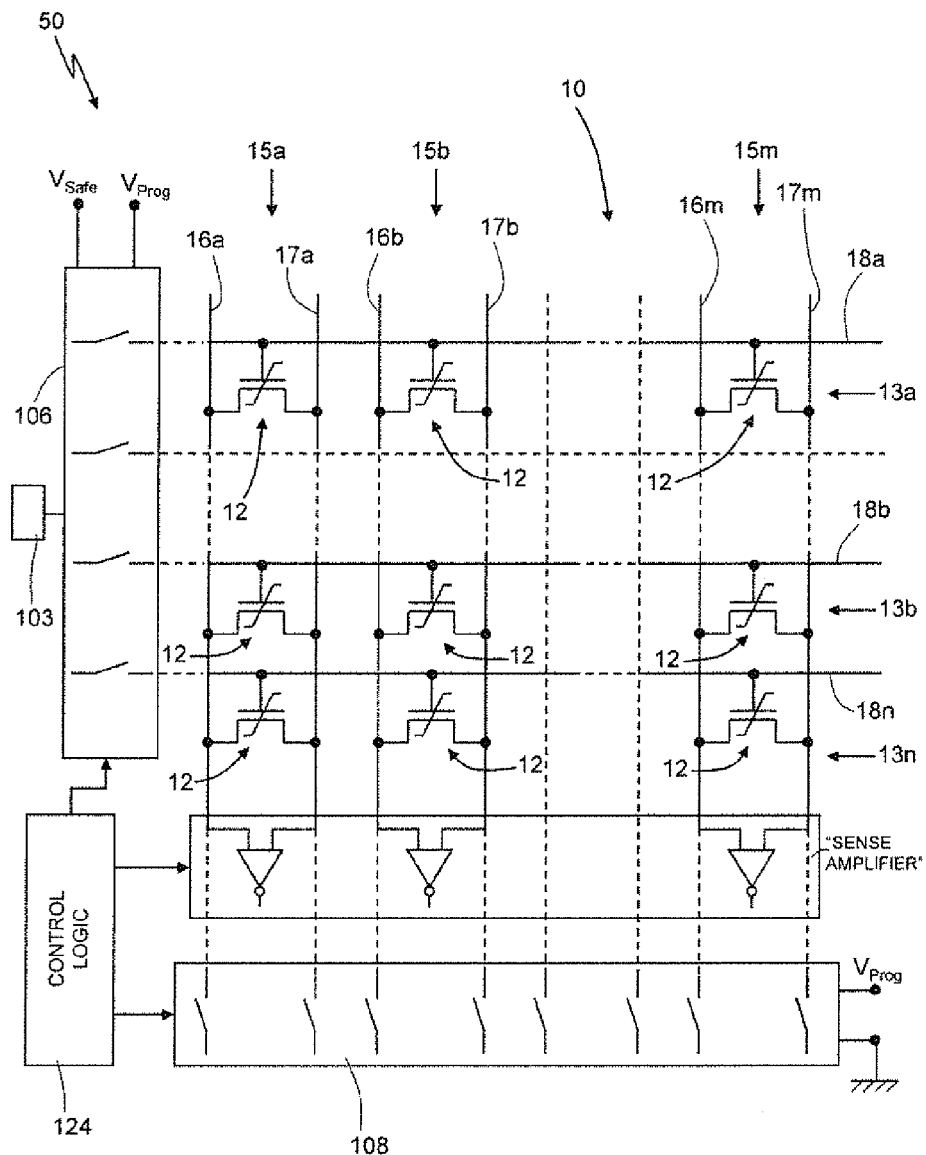
FIG. 11 shows a memory comprising the memory portion of FIG. 2.

Using the circuit of FIGS. 10a-10d a considerable advantage is achieved in terms of time as compared to the use of the circuit according to FIGS. 9a-9f, at the expense of a greater occupation of area. FIG. 11 shows an architecture of a memory 100, which comprises the memory portion 10 of FIG. 2 and the comparison circuit according to FIGS. 9a-9f or 10a-10d.

The memory 100 further comprises a row decoder 106, connected to the wordlines 18a-n of each row 13a-n, which is designed to connect appropriately the wordlines to a voltage-generator block 103 (or to ground voltage) and is configured for biasing, according to the steps of the method of FIG. 5, the wordlines 18a-n at the operating voltages.

For the column 15a-m that is to be read, a sense-amplifier block, comprising the comparison circuit according to FIGS. 9a-9f or 10a-10d, is configured for receiving the current $i_{TOT}$ and converting it into a voltage value $V_a$, $V_b$, and then comparing the signals $V_a$ and $V_b$ with one another according to the steps of the method of FIG. 5.

The output of the sense-amplifier block is connected to a control logic 124, configured for receiving the compared signal and identifying, on the basis of the signal, the logic value of the logic datum stored in the transistor that is being read.

From an examination of the characteristics of the invention provided according to the present disclosure the advantages that it affords are evident.

In particular, the reading operation described is non-destructive, in so far as it is based upon the application of reading pulses with amplitude lower than the coercive voltage of the ferroelectric material so that the polarization of the material returns into the starting stable state once the operation of reading of the data has terminated. Given that the reading operation does not cause erasure of the data stored, the presence of a data-storage buffer and re-writing of the data read is not necessary.

In addition, even though the circuit for generation of reference values 60 occupies area, the saving of area due to the memory architecture of a 1T type makes up for this disadvantage.

Finally, it is clear that modifications and variations may be made to what has been described and illustrated herein, without thereby departing from the sphere of protection of the present invention, as defined in the annexed claims.

For example, the reading step can be carried out in a way similar to what has been described using a negative voltage $V_{read}$, and hence operating on the rising portion of the hysteresis curve. In this case, the presence of a value "0" stored in the memory cell 12 that is to be read will cause an increase of the current between source and drain of the respective memory cell 12; instead, the presence of a value "0" stored in the memory cell 12 that is to be read will cause a non-significant variation of the current between source and drain of the respective memory cell 12.

That which is claimed is:

1. A method for non-destructive reading of data stored in a memory comprising a first wordline, a first bitline, a second bitline, and a first ferroelectric transistor, the first ferroelectric transistor having a first conduction terminal coupled to the first bitline, a second conduction terminal coupled to the second bitline, and a control terminal coupled to the first wordline, the first ferroelectric transistor further comprising a layer of ferroelectric material in a stable state of polarization and capable of assuming high and low logic values, the method comprising:
applying to the first wordline a first reading voltage to bias the control terminal of the first ferroelectric transistor to a first biasing value so as not to cause a variation of the stable state of polarization of the layer of ferroelectric material;
generating a first sense voltage between the first and second bitlines;
generating a first value representative of a current that flows between the first and second bitlines during application of the first reading voltage and of the first sense voltage;
applying to the first wordline a second reading voltage to bias the control terminal of the first ferroelectric transistor to a second biasing value different from the first biasing value so as not to cause a variation of the stable state of polarization of the layer of ferroelectric material;
generating a second sense voltage between the first and second bitlines;
generating a second value representative of a current that flows between the first and second bitlines during application of the second reading voltage and the second sense voltage; and
comparing the first and second values, and determining a logic value of the data based thereupon.

2. The method according to claim 1, wherein an output current curve of the ferromagnetic transistor demonstrates a hysteretic behaviour; wherein application of the first reading voltage determines a displacement of a value of an output current along the output current curve; and wherein comparing the first and the second output values and determining the logic value of the data comprises evaluating a degree of the displacement of the value of the output current along the curve, and associating the degree to one of a high logic value and a low logic value.

3. The method according to claim 1, wherein the second sense voltage is proportional to the first sense voltage.

4. The method according to claim 1, wherein the memory comprises a second wordline and a second ferroelectric transistor, the second ferroelectric transistor having a first conduction terminal coupled to the first bitline, a second conduction terminal coupled to the second bitline, and a control terminal coupled to the second wordline, the second ferroelectric transistor comprising a layer of ferroelectric material in a stable state of polarization capable of being associated with a high logic value and a low logic value, the method further comprising:
applying to the second wordline the first reading voltage to bias the control terminal of the second ferroelectric transistor to the first biasing value so as not to cause a variation of the stable state of the polarization of the layer of ferroelectric material of the second ferroelectric transistor.

5. The method according to claim 1, wherein generating the first and second values comprises detecting a total current that flows between the first and second bitlines and converting the total current into a corresponding voltage value.

6. A method for reading of data stored in a memory comprising a first wordline, a first bitline, a second bitline, and a first ferroelectric transistor, the first ferroelectric transistor having a first conduction terminal coupled to the first bitline, a second conduction terminal coupled to the second bitline, and a control terminal coupled to the first wordline, the first ferroelectric transistor further capable of assuming high and low logic values, the method comprising:

applying to the first wordline a first reading voltage to bias the control terminal of the first ferroelectric transistor to a first biasing value;

generating a first sense voltage between the first and second bitlines;

generating a first value representative of a current that flows between the first and second bitlines during application of the first reading voltage and of the first sense voltage;

applying to the first wordline a second reading voltage to bias the control terminal of the first ferroelectric transistor to a second biasing value different from the first biasing value;

generating a second sense voltage between the first and second bitlines;

generating a second value representative of a current that flows between the first and second bitlines during application of the second reading voltage and the second sense voltage;

comparing the first and second values, and determining a logic value of the data based thereupon.

7. The method according to claim 6, wherein an output current curve of the ferromagnetic transistor demonstrates a hysteretic behaviour; wherein application of the first reading voltage determines a displacement of a value of an output current along the output current curve; and wherein comparing the first and the second output values and determining the logic value of the data comprises evaluating a degree of the displacement of the value of the output current along the curve, and associating the degree to one of a high logic value and a low logic value.

8. The method according to claim 6, wherein the second sense voltage is proportional to the first sense voltage.

9. The method according to claim 6, wherein the memory comprises a second wordline and a second ferroelectric transistor, the second ferroelectric transistor having a first conduction terminal coupled to the first bitline, a second conduction terminal coupled to the second bitline, and a control terminal coupled to the second wordline, the second ferroelectric transistor comprising a layer of ferroelectric material in a stable state of polarization capable of being associated with a high logic value and a low logic value, the method further comprising:

applying to the second wordline the first reading voltage to bias the control terminal of the second ferroelectric transistor to the first biasing value so as not to cause a variation of the stable state of the polarization of the layer of ferroelectric material of the second ferroelectric transistor.

10. The method according to claim 6, wherein generating the first and second values comprises detecting a total current that flows between the first and second bitlines and converting the total current into a corresponding voltage value.

11. A ferroelectric memory comprising:
a first wordline;
a first bitline;
a second bitline;
a first ferroelectric transistor comprising a layer of ferroelectric material in a stable state of polarization and capable of assuming high and low logic values of data and having a first conduction terminal coupled to the first bitline, a second conduction terminal coupled to the second bitline, and a control terminal coupled to the first wordline;

a first generator to generate a first reading voltage and coupled to the first wordline, the first generator configured for biasing, via the first wordline, the control terminal of the first ferroelectric transistor to a first biasing value so as not to cause a variation of the stable state of polarization of the layer of ferroelectric material of the first ferroelectric transistor;

a second generator to generate a first sense voltage between the first and second bitlines;

a first reading circuit coupled to at least one of the first bitline and the second bitline, and configured for generating a first value representative of a current that flows between the first and second bitlines during application of the first reading voltage and the first sense voltage;

a third generator to generate a second reading voltage and coupled to the first wordline, configured for biasing, via the first wordline, the control terminal of the first ferroelectric transistor to a second biasing value different from the first biasing value and so as not to cause a variation of the stable state of polarization of the layer of ferroelectric material of the first ferroelectric transistor;

a fourth generator to generate a second sense voltage coupled between the first and second bitlines;

a second reading circuit, coupled to at least one of the first bitline and the second bitline, and configured for generating a second value representative of a current that flows between the first and second bitlines during application of the second reading voltage and the second sense voltage;

a comparison circuit coupled to the first and second reading circuits for receiving the first and second values and configured for comparing the first and second output values; and control circuitry coupled to the comparison circuit and configured for determining the logic value of the data based upon the comparison of the first and second output values.

12. The memory according to claim 11, wherein an output current curve of the ferromagnetic transistor demonstrates a hysteretic behaviour; wherein application of the first reading voltage determines a displacement of a value of an output current along the output current curve; and wherein comparing the first and the second output values and determining the logic value of the data comprises evaluating a degree of the displacement of the value of the output current along the curve, and associating the degree to one of a high logic value and a low logic value.

13. The memory according to claim 12, wherein the second sense voltage is proportional to the first sense voltage.

14. The memory according to claim 11, further comprising:

a second wordline and a second ferroelectric transistor;
the second ferroelectric transistor having a first conduction terminal coupled to the first bitline, a second conduction terminal coupled to the second bitline, and a control terminal coupled to the second wordline, the second ferroelectric transistor also comprising a layer of ferroelectric material in a stable state of polarization and capable of association with one of a high logic value and a low logic value; and a fifth generator coupled to the second wordline and configured for biasing, via the second wordline, the control terminal of the second ferroelectric transistor to the first biasing value, the first biasing value being so as not to cause a variation of the stable state of polarization of the layer of ferroelectric material of the second ferroelectric transistor.

* * * * *